US009613795B2

(12) United States Patent
Morikazu et al.

(10) Patent No.: US 9,613,795 B2
(45) Date of Patent: Apr. 4, 2017

(54) WAFER PROCESSING METHOD TO REMOVE CRYSTAL STRAINS (71) Applicant: DISCO CORPORATION, Tokyo (JP)

(72) Inventors: Hiroshi Morikazu, Tokyo (JP); Kenya Kai, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/704,474

(22) Filed: May 5, 2015

(65) Prior Publication Data
US 2015/0332910 A1 Nov. 19, 2015

(30) Foreign Application Priority Data

May 13, 2014 (JP) ................................. 2014-099447

(51) Int. Cl.
H01L 21/02 (2006.01)
H01L 21/263 (2006.01)
H01L 21/268 (2006.01)

(52) U.S. Cl.
CPC .. *H01L 21/02021* (2013.01); *H01L 21/02013* (2013.01); *H01L 21/268* (2013.01); *H01L 21/2633* (2013.01)

(58) Field of Classification Search
CPC ......... H01L 21/02021; H01L 21/02013; H01L 21/268; H01L 21/2633
See application file for complete search history.

(56) References Cited

U.S. PATENT DOCUMENTS

| 5,212,394 A * | 5/1993 | Iwasaki ................... C30B 15/00 117/94 |
| 8,623,136 B1 * | 1/2014 | Matthews ............. H01L 23/544 117/11 |
| 2006/0079155 A1 * | 4/2006 | Nakamura .............. B24B 7/228 451/41 |
| 2014/0326295 A1 * | 11/2014 | Moslehi .................. H01L 31/18 136/249 |
| 2014/0334511 A1 * | 11/2014 | Takeda ...................... H01S 3/10 372/41 |

FOREIGN PATENT DOCUMENTS

| JP | 2010-207988 | 9/2010 |
| JP | 2010207988 A * | 9/2010 |

* cited by examiner

*Primary Examiner* — John P Dulka
(74) *Attorney, Agent, or Firm* — Greer Burns & Crain Ltd.

(57) ABSTRACT

A wafer is formed by slicing a single crystal ingot and removing crystal strains remaining in a peripheral portion of the wafer. In the crystal strain removing step, a laser beam having such a wavelength as to be transmitted through the wafer is applied to the wafer from one side of the wafer in positions located along the margin of the wafer and spaced a predetermined distance inward from the margin, to cause growth of fine holes and amorphous regions shielding the fine holes, over the range from one side to the other side of the wafer, whereby shield tunnels are formed in an annular pattern. Then, an external force is applied to the wafer along the shield tunnels so as to break the wafer in the region of the shield tunnels, thereby removing the peripheral wafer portion where the crystal strains are remaining.

2 Claims, 8 Drawing Sheets

WAFER PROCESSING METHOD TO REMOVE CRYSTAL STRAINS

BACKGROUND OF THE INVENTION

Field of the Invention

The present invention relates to a method of processing a wafer of silicon carbide (SiC), gallium nitride (GaN) or the like to be a substrate on which to stack a light emitting layer for forming optical devices such as LEDs.

Description of the Related Art

A wafer of silicon carbide (SiC), gallium nitride (GaN) or the like on which to stack a light emitting layer for forming optical devices such as LEDs is formed by slicing a single crystal ingot of silicon carbide (SiC), gallium nitride (GaN) or the like into a predetermined thickness by a wire-saw or the like (see, for example, Japanese Patent Laid-open No. 2010-207988). Of the wafer formed by slicing the single crystal ingot, the front side and/or the back side is ground and finished to a mirror surface.

SUMMARY OF THE INVENTION

When the front side or the back side of a wafer is ground, however, warping and eventual breakage of the wafer may occur, leading to a poor productivity. Besides, when warping of a wafer occurs, it is impossible to uniformly stack a light emitting layer on the wafer, which leads to variations in quality of the final products, namely, optical devices such as LEDs. It is considered that warping occurs upon grinding of the front side or the back side of a wafer because crystal strains are remaining in a peripheral portion of the wafer upon production of the ingot.

Accordingly, it is an object of the present invention to provide a wafer processing method by which a wafer formed by slicing a single crystal ingot can be processed while preventing the wafer from warping.

In accordance with an aspect of the present invention, there is provided a method of processing a wafer formed by slicing a single crystal ingot, including a crystal strain removing step of removing crystal strains remaining in a peripheral portion of the wafer.

In the crystal strain removing step, preferably, a laser beam having such a wavelength as to be transmitted through the wafer is applied to the wafer from one side of the wafer, in positions located along a margin (edge) of the wafer and spaced a predetermined distance inward from the margin, so as to cause growth of fine holes and amorphous regions shielding the fine holes, over a range from the one side to other side of the wafer, thereby forming shield tunnels in an annular pattern, and an external force is exerted on the wafer along the shield tunnels to break the wafer in a region of the shield tunnels, thereby removing the peripheral portion where the crystal strains are remaining.

In the crystal strain removing step, preferably, a laser beam having such a wavelength as to be absorbed in the wafer is applied to the wafer from one side of the wafer, along a line extending along a margin (edge) of the wafer and spaced a predetermined distance inward from the margin, so as to effect ablation and form a laser-processed groove along the margin of the wafer, thereby removing the peripheral portion where the crystal strains are remaining.

Further, it is desirable to conduct a mark forming step of forming a mark indicative of a crystal orientation, in a position on an inner side of a laser beam-applied region on the one side of the wafer.

In the method of processing a wafer formed by slicing a single crystal ingot according to the present invention, the crystal strain removing step of removing the crystal strains remaining in the peripheral portion of the wafer is carried out. Therefore, even when the one side or the other side of the wafer is ground, warping of the wafer due to the presence of the remaining crystal strains is avoided. Accordingly, in stacking a light emitting layer on the ground side of the wafer in a subsequent step, a light emitting layer having a uniform thickness can be formed because of the absence of warp.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
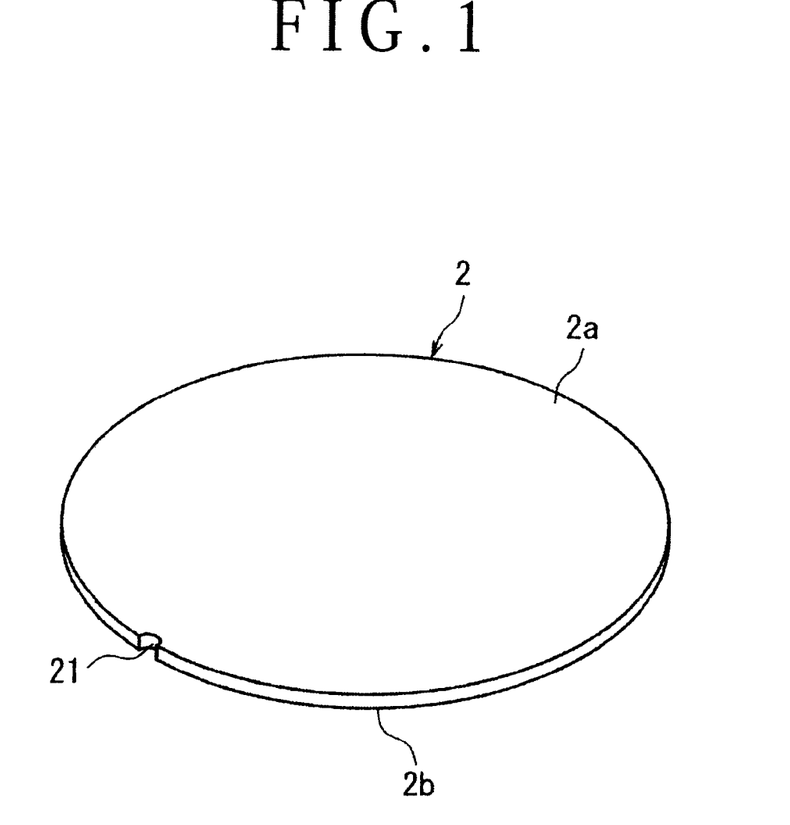
FIG. 1 is a perspective view of a wafer formed by slicing a single crystal ingot.

The wafer processing method according to the present invention will be described more in detail below, referring to the drawings. FIG. 1 shows a perspective view of a wafer to be processed by the wafer processing method of the present invention. The wafer 2 shown in FIG. 1 is formed by slicing a single crystal ingot of silicon carbide (SiC), gallium nitride (GaN) or the like into a predetermined thickness (for example, 700 to 800 μm) by a wire-saw or the like, and is provided at the periphery thereof with a notch 21 indicative of the crystal orientation. The wafer 2 thus formed by slicing a single crystal ingot has crystal strains remaining in a peripheral portion thereof.

In the wafer processing method of the present invention, a crystal strain removing step of removing the crystal strains remaining in the peripheral portion of the wafer 2 is carried out. A first embodiment of the crystal strain removing step is carried out using a laser processing apparatus 3 shown in FIG. 2. The laser processing apparatus 3 depicted in FIG. 2 includes a chuck table 31 for holding a workpiece thereon, and laser beam applying means 32 for applying a laser beam to the workpiece held on the chuck table 31. The chuck table 31 is configured to hold the workpiece by suction, and to be rotated in the direction indicated by arrow 31a in FIG. 2 by a rotating mechanism (not shown).

Figure 3A:
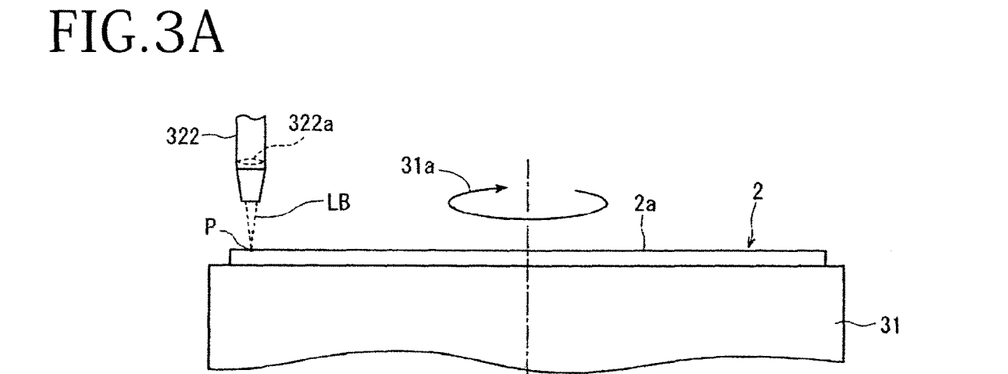
FIGS. 3A to 3C are views for explaining the first embodiment of the crystal strain removing step.
Figure 3B:
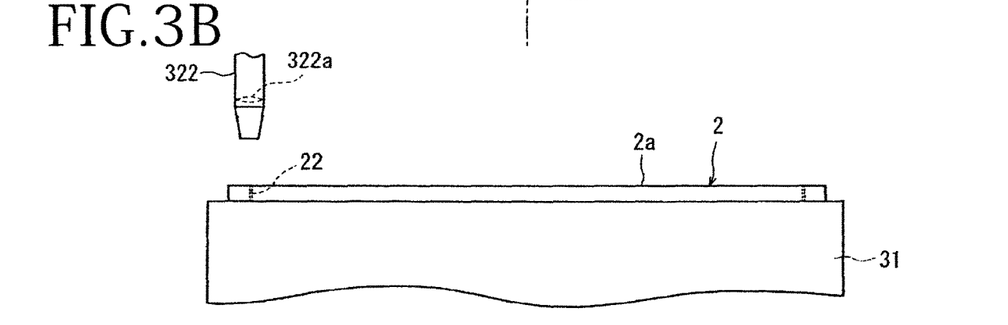
Figure 3C:
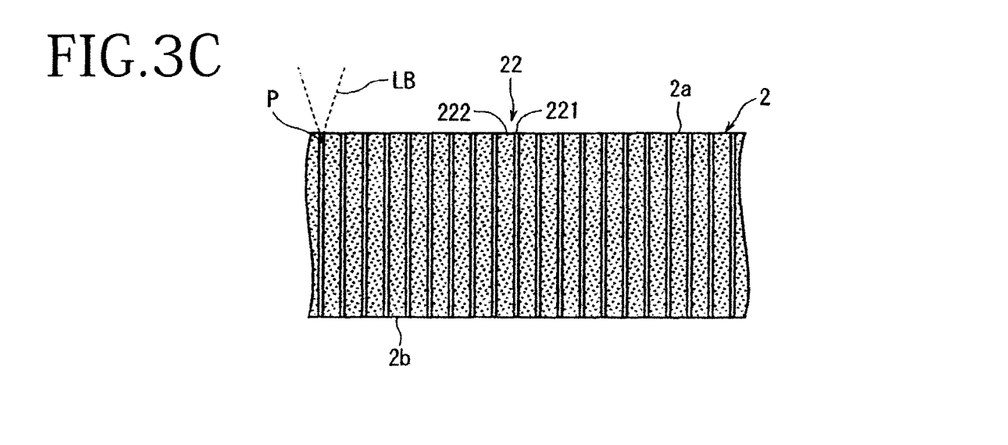

The laser beam applying means 32 includes a cylindrical casing 321 disposed substantially horizontally. Pulsed laser beam oscillation means (not shown) including a pulsed laser beam oscillator and repetition frequency setting means is disposed inside the casing 321. A focusing device 322 having a focusing lens 322a (see FIG. 3) for focusing the pulsed laser beam oscillated from the pulsed laser beam oscillation means is mounted to a tip portion of the casing 321. The focusing lens 322a of the focusing device 322 has a numerical aperture (NA) set as follows. The numerical aperture (NA) of the focusing lens 322a is set so that a value obtained by dividing the numerical aperture (NA) by the refractive index (N) of the single crystal substrate falls within the range of 0.05 to 0.2 (numerical aperture setting step). Note that the laser beam applying means 32 includes focal point position adjusting means (not shown) for adjusting the position of the focal point of the pulsed laser beam focused by the focusing lens 322a of the focusing device 322.

The first embodiment of the crystal strain removing step carried out by use of the aforementioned laser processing apparatus 3 will be described referring to FIGS. 3A to 3C. In the first embodiment of the crystal strain removing step, first, as shown in FIG. 3A, the wafer 2 is put on the chuck table 31 of the laser processing apparatus 3, with its one side 2a up and its other side 2b down, and is suction held on the chuck table 31. The chuck table 31 with the wafer 2 held thereon by suction is moved by a moving mechanism (not shown) into a processing region in which the focusing device 322 is located, and the chuck table 31 is positioned so that a position spaced a predetermined distance inward from the margin (edge) of the wafer 2 is positioned directly under the focusing device 322. Then, the focal point position adjusting means (not shown) is operated to move the focusing device 322 in an optical axis direction so that the focal point P of a pulsed laser beam LB focused by the focusing lens 322a of the focusing device 322 is positioned into a desired position in the thickness direction of the wafer 2 (positioning step). Note that in this embodiment, the focal point P of the pulsed laser beam is set in a desired position inside the wafer 2 in relation to the upper surface (one side 2a) to which to apply the pulsed laser beam (the desired position is, for example, a position spaced by 5 to 10 μm from the one side 2a toward the other side 2b of the wafer 2).

Next, while applying the pulsed laser beam LB having a wavelength such as to be transmitted through the wafer 2 by way of the focusing device 322, the chuck table 31 is rotated in the direction of arrow 31a in FIG. 3A (shield tunnel forming step). After the chuck table 31 is rotated one revolution, the application of the pulsed laser beam is stopped, and the rotation of the chuck table 31 is stopped, as shown in FIG. 3B.

When the aforementioned shield tunnel forming step is carried out, fine holes 221 and amorphous regions 222 surrounding the fine holes 221, both extending from the one side 2a (upper surface) of the wafer 2 toward the other side 2b (lower surface) of the wafer 2, are grown in the vicinity of each focal point P of the pulsed laser beam LB, as shown in FIGS. 3B and 3C. As a result, amorphous shield tunnels 22 are formed in an annular pattern along the margin or the edge of the wafer 2. The shield tunnels 22 are formed so that the adjacent amorphous regions 222 are connected to each other. Note that the amorphous shield tunnels 22 formed in the aforementioned shield tunnel forming step can be formed over the range from the one side 2a as the upper surface of the wafer 2 to the other side 2b as the lower surface of the wafer 2. Therefore, it is sufficient to conduct the application of the pulsed laser beam only once, even if the wafer 2 is thick. Thus, the productivity of this step is very high.

Note that the processing conditions in the shield tunnel forming step are set as follows.

| | |
|---|---|
| Wavelength of laser beam | 1030 nm |
| Repetition frequency | 50 kHz |
| Pulse width | 10 ps |
| Average output | 6 W |
| Focused spot diameter | 3.3 to 13 μm |
| | (The focused spot diameter can be obtained by the formula: d = (2λ)/(π · NA). When calculated assuming that wavelength λ is 1030 nm, d is 3.3 μm when NA is 0.2, and d is about 13 μm when NA is 0.05.) |
| Circumferential speed | 200 mm/second |

Figure 4:
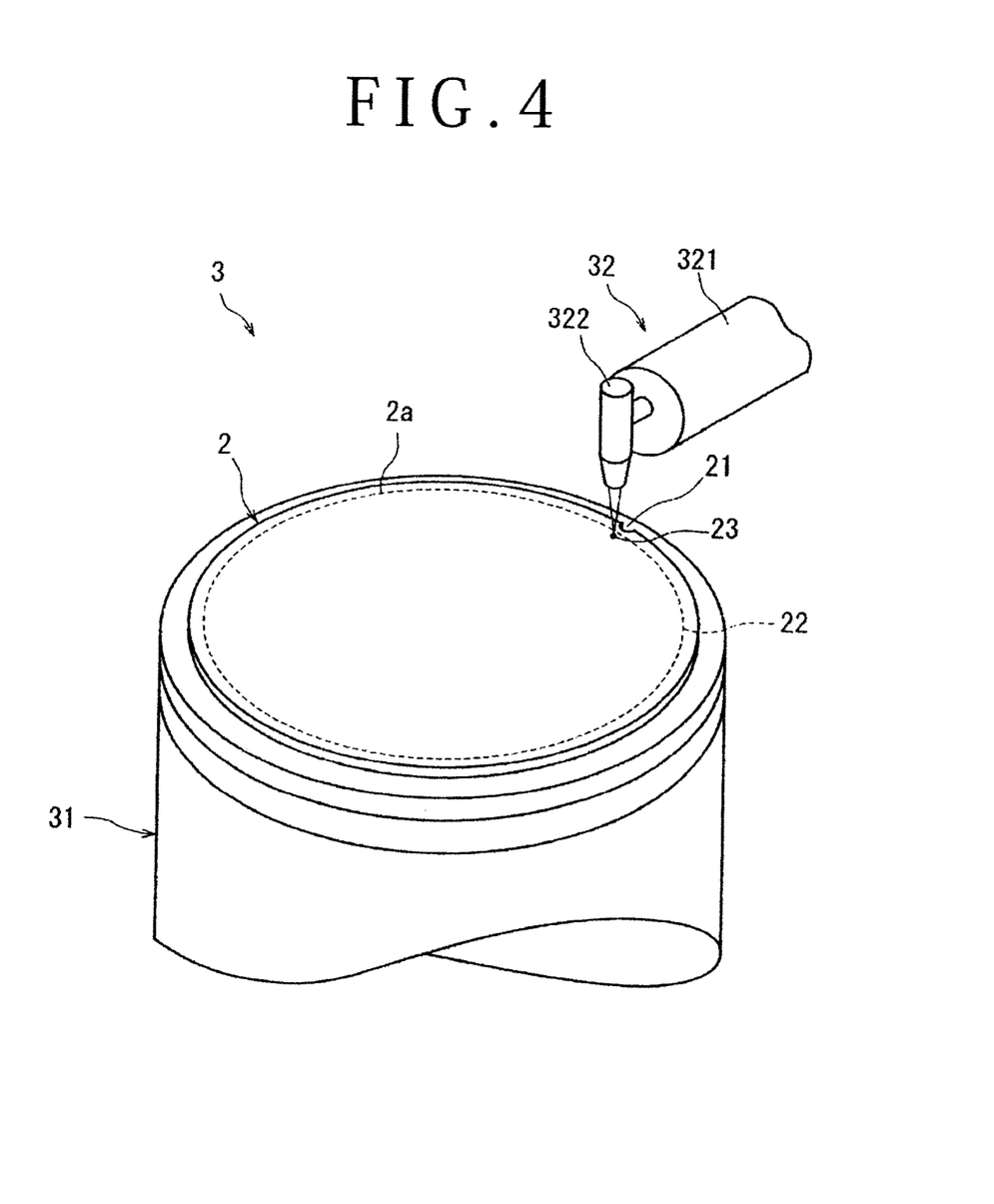
FIG. 4 is a view for explaining a mark forming step of forming a mark indicative of a crystal orientation of the wafer subjected to the first embodiment of the crystal strain removing step.

Note that it is desirable that a mark forming step of forming a mark 23 indicative of the crystal orientation is applied to the upper surface (one side 2a) of the wafer 2 having undergone the aforementioned shield tunnel forming step, by positioning the focusing device 322 in a position directly over the position corresponding to the notch 21 on the inner side of the laser beam-applied region, and applying a pulsed laser beam to the wafer 2, as shown in FIG. 4. The mark forming step may be carried out before the shield tunnel forming step is performed. Note that the means to be used in the mark forming step is not limited to the laser beam, and a mark 23 indicative of the crystal orientation may be formed by other means, such as printing means.

Figure 5:
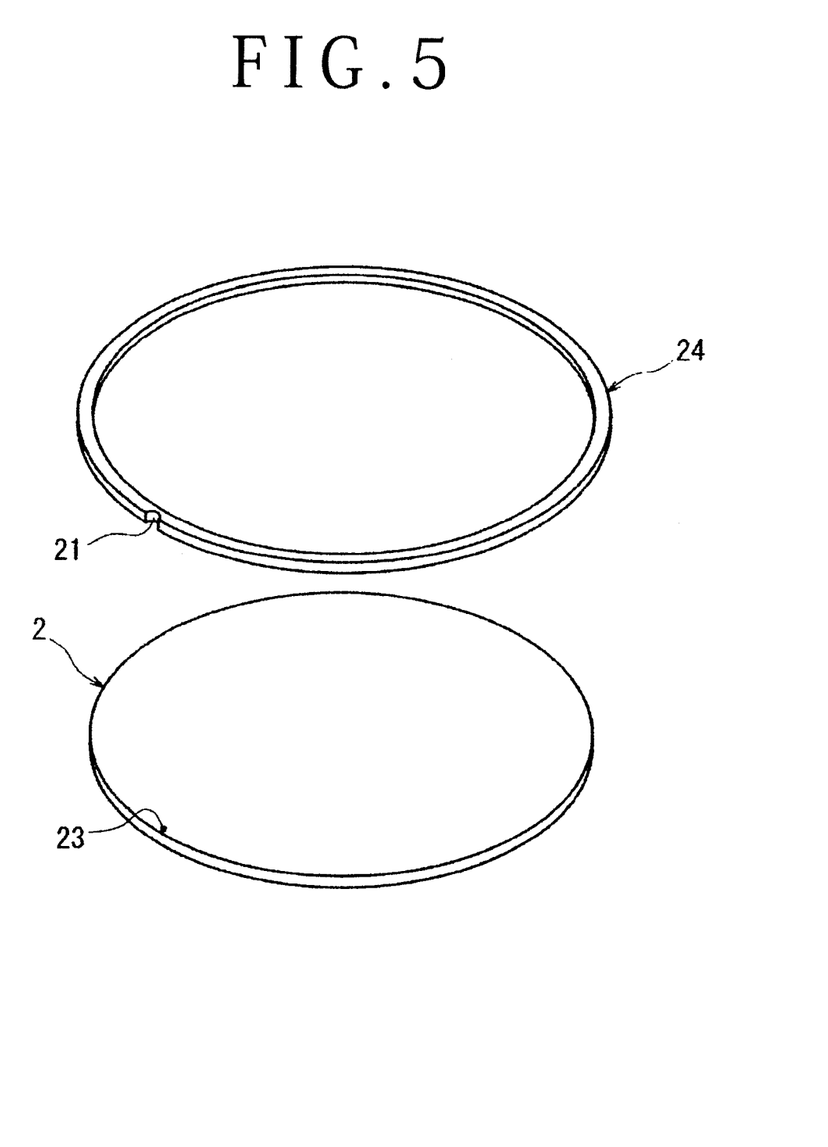
FIG. 5 is a view for explaining a peripheral portion removing step in the crystal strain removing step.

The shield tunnels 22 formed in an annular pattern in the peripheral portion of the wafer 2 by carrying out the aforementioned shield tunnel forming step have a lowered strength. When an external force is applied to the wafer 2 along the shield tunnels 22 formed in the annular pattern, therefore, the wafer 2 is broken in the region of the shield tunnels 22, and the peripheral portion 24 where the crystal strains are remaining is removed, as shown in FIG. 5 (peripheral portion removing step). Note that although the notch 21 indicative of the crystal orientation which has been formed at the periphery of the wafer 2 is removed together with the peripheral portion 24 by the peripheral portion removing step, the mark 23 indicative of the crystal orientation is formed in the position (on the inner side of the shield tunnels 22) corresponding to the notch 21 by the mark forming step, so that the crystal orientation can be confirmed even after the removal of the peripheral portion 24.

Figure 2:
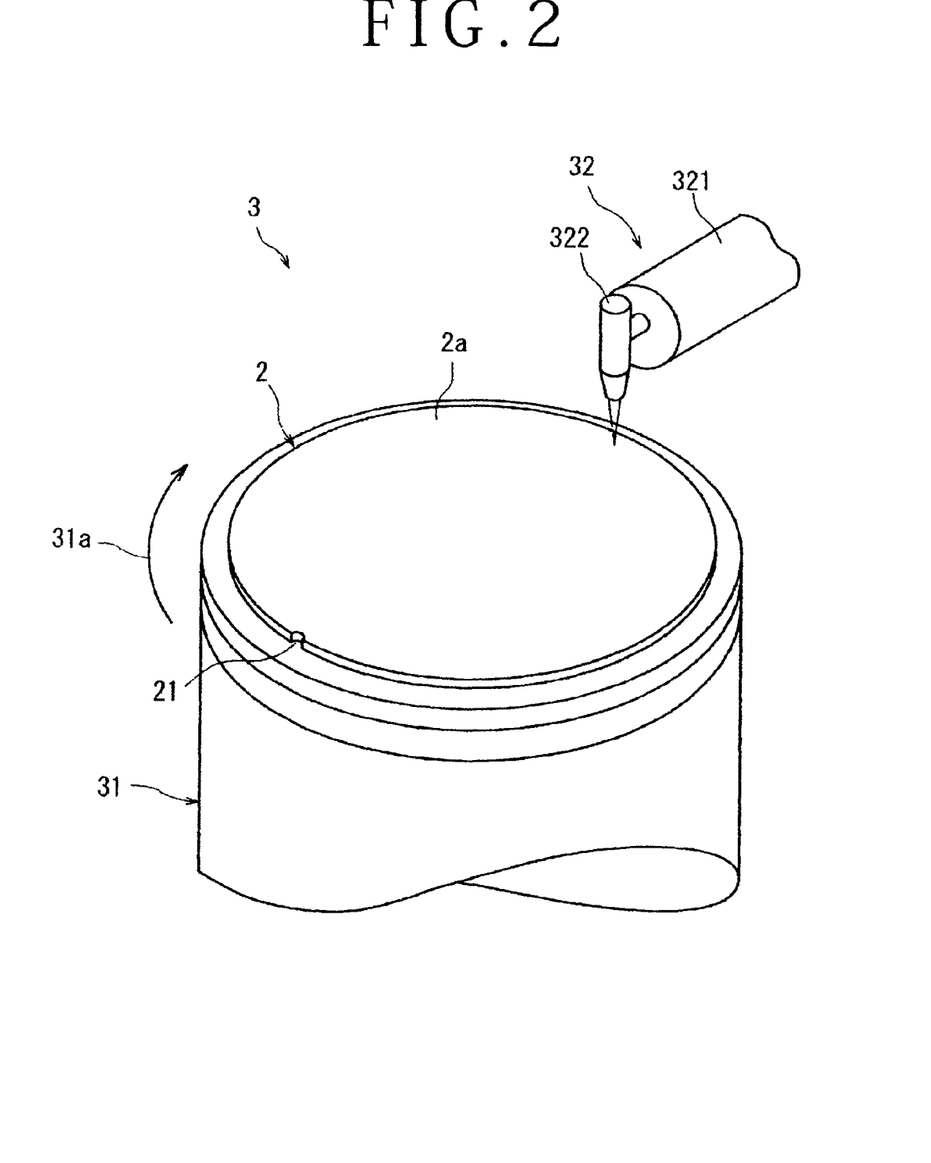
FIG. 2 is a major part perspective view of a laser processing apparatus for carrying out a first embodiment of a crystal strain removing step.
Figure 6:
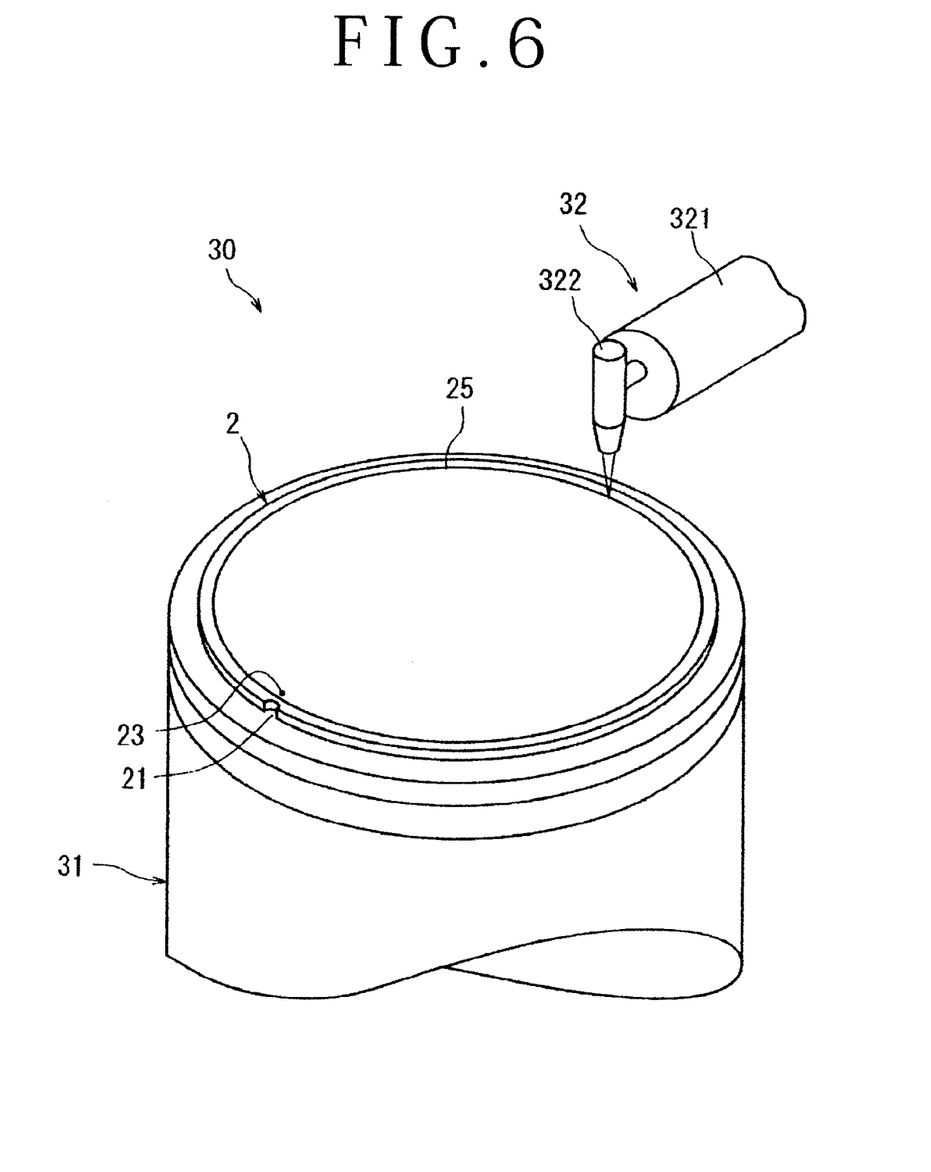
FIG. 6 is a major part perspective view of a laser processing apparatus for carrying out a second embodiment of the crystal strain removing step.
Figure 7A:
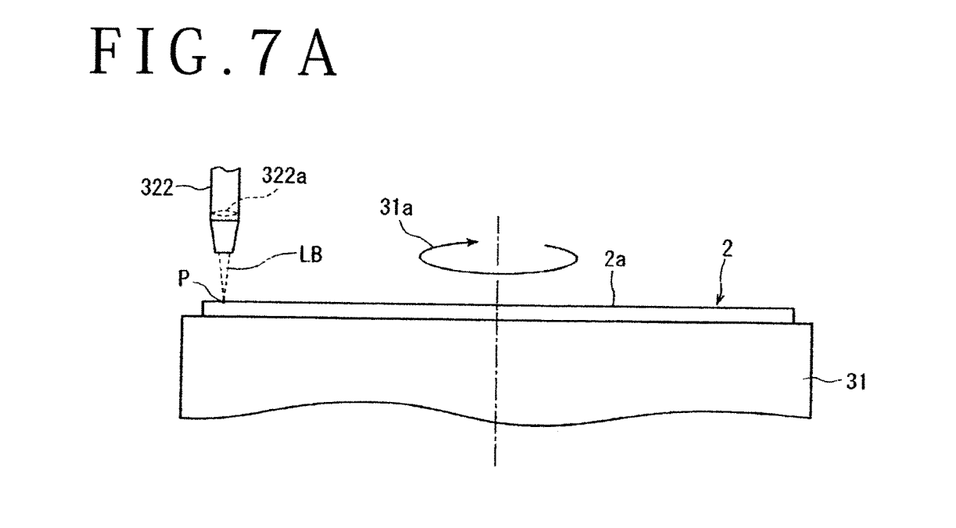
FIGS. 7A and 7B are views for explaining the second embodiment of the crystal strain removing step.
Figure 7B:
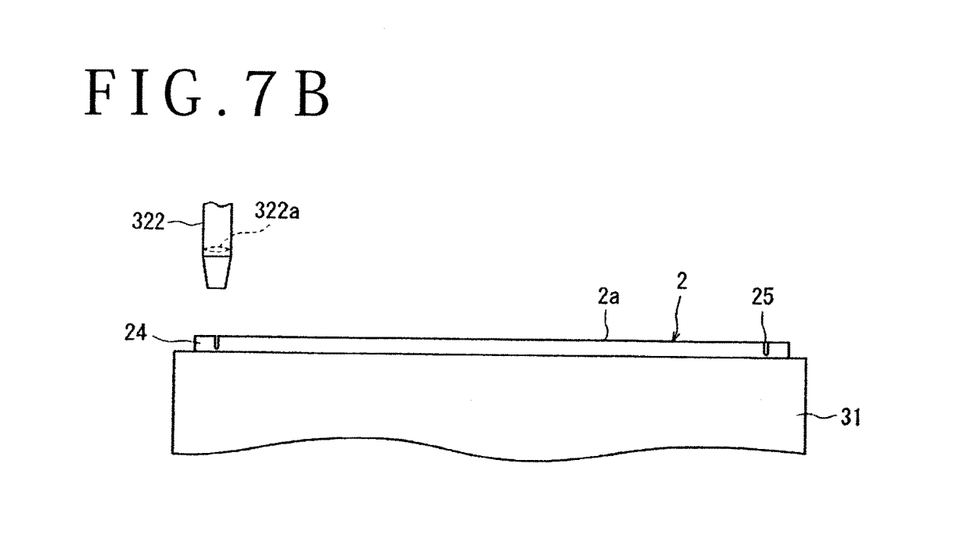

A second embodiment of the crystal strain removing step of removing crystal strains remaining in a peripheral portion of the wafer 2 will be described below, referring to FIGS. 6, 7A and 7B. Note that a laser processing apparatus 30 for carrying out the second embodiment is substantially the same in configuration as the laser processing apparatus 3 shown in FIG. 2, and, therefore, the same members as those in FIG. 2 are denoted by the same reference symbols as used in FIG. 2, and descriptions of them are omitted here.

In the second embodiment, a laser beam having a wavelength such as to be absorbed in the wafer 2 is applied to the wafer 2 from one side of the wafer 2, along a line extending along the margin or the edge of the wafer 2 and spaced a predetermined distance inward from the margin, to effect ablation of the wafer 2 and form a laser-processed groove along the margin, thereby removing the peripheral wafer portion where the crystal strains are remaining. Specifically, as shown in FIGS. 6 and 7A, a position spaced a predetermined distance inward from the margin of the wafer 2 held by the chuck table 31 is positioned in a position directly under the focusing device 322. Then, while applying a pulsed laser beam having a wavelength such as to be absorbed in the wafer 2 to the wafer 2 via the focusing device 322, the chuck table 31 is rotated one revolution in the direction of arrow 31a in FIG. 7A. In this case, the focal point P of the pulsed laser beam applied via the focusing device 322 is set in the vicinity of one side 2a as the upper surface of the semiconductor wafer 2. As a result, as shown in FIG. 7B, an annular laser-processed groove 25 extending from the one side 2a (upper surface) of the wafer 2 to the other side 2b (lower surface) of the wafer 2 is formed along a line spaced a predetermined distance inward from the margin of the wafer 2, whereby the peripheral portion 24 which is on the outer side of the annular laser-processed groove 25 and in which the crystal strains are remaining is removed (laser-processed groove forming step).

The processing conditions in the aforementioned laser-processed groove forming step are set, for example, as follows.

| Wavelength of laser beam | 355 nm |
| Repetition frequency | 10 kHz |
| Pulse width | 50 ns |
| Average output | 7 W |
| Focused spot diameter | 5 to 15 μm |
| Circumferential speed | 500 mm/second |

Note that it is desirable that, after or before the laser-processed groove forming step is performed as above, a mark forming step of forming a mark 23 (see FIG. 6) indicative of the crystal orientation on the upper surface (one side 2a) of the wafer 2 is conducted by positioning the focusing device 322 in a position directly over the position corresponding to the notch 21 on the inner side of the laser beam-applied region, and applying a pulsed laser beam to the upper surface (one side 2a).

After the crystal strain removing step including the aforementioned shield tunnel forming step or the aforementioned laser-processed groove forming step is conducted, a grinding step is carried out in which one side of the wafer deprived of the peripheral portion is ground to bring the wafer to a predetermined finished thickness. The grinding step is conducted using a grinding apparatus 4 shown in FIG. 8A. The grinding apparatus 4 depicted in FIG. 8A includes a chuck table 41 for holding a workpiece thereon, and grinding means 42 for grinding the workpiece held on the chuck table 41. The chuck table 41 is configured to suction hold the workpiece on its upper surface constituting a holding surface, and is rotated in the direction of arrow 41a in FIG. 8A by a rotational driving mechanism (not shown). The grinding means 42 includes a spindle housing 421, a rotating spindle 422 rotatably supported by the spindle housing 421 and rotated by the rotational driving mechanism (not shown), a mounter 423 attached to a lower end of the rotating spindle 422, and a grinding wheel 424 mounted to a lower surface of the mounter 423. The grinding wheel 424 includes a circular annular base 425, and grindstones 426 mounted to a lower surface of the base 425 in an annular pattern. The base 425 is attached to the lower surface of the mounter 423 by fastening bolts 427.

Figure 8A:
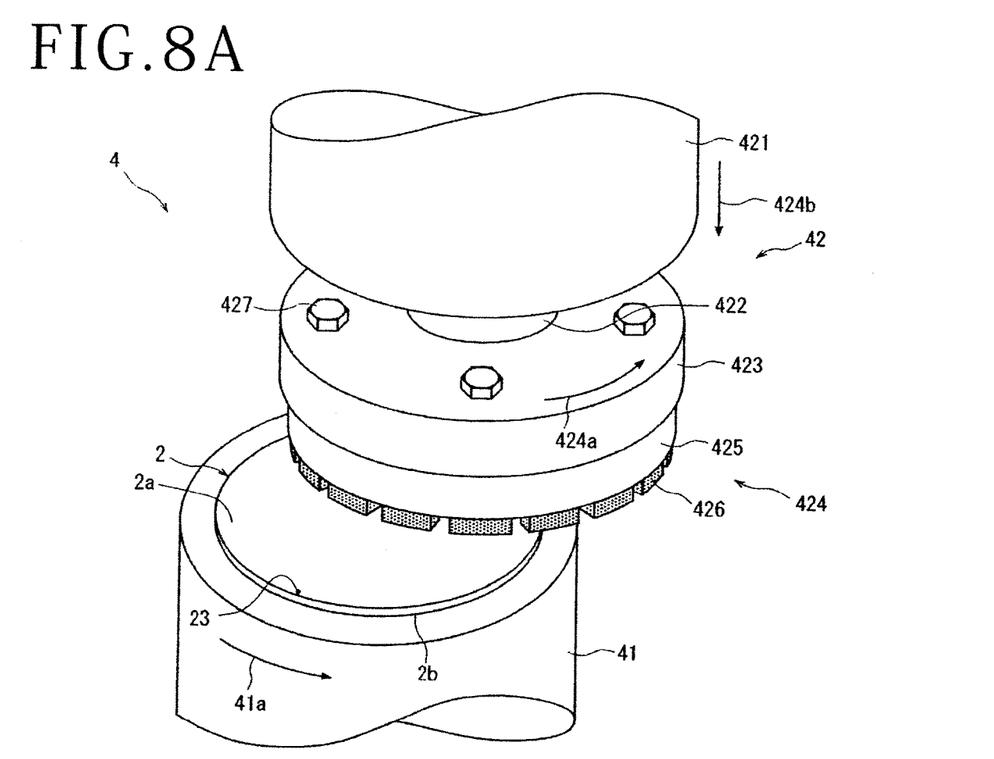
FIGS. 8A and 8B are views for explaining a grinding step.
Figure 8B:
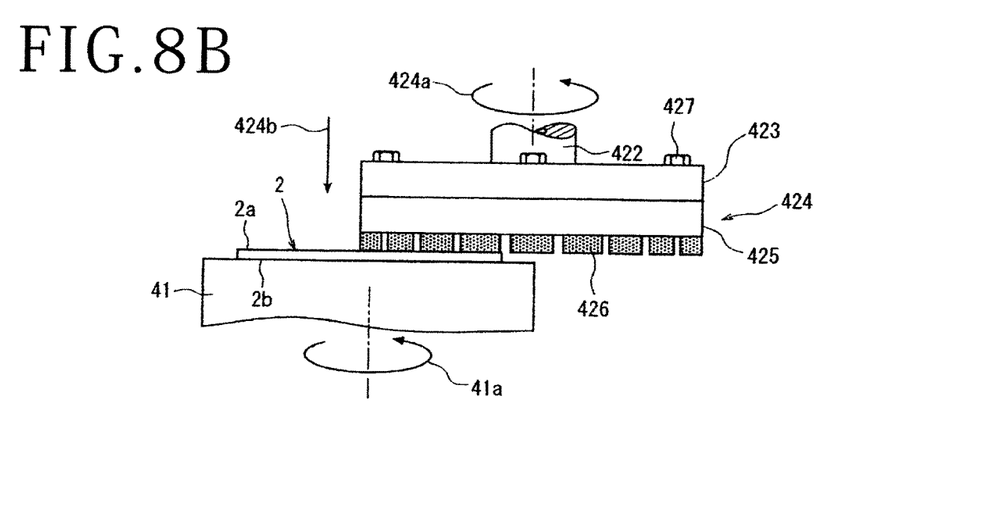

In carrying out the grinding step by use of the aforementioned grinding apparatus 4, first, the wafer 2 is put on the chuck table 41, with the other side 2b of the wafer 2 being in contact with the upper surface (holding surface) of the chuck table 41 as shown in FIG. 8A. Then, suction means (not shown) is operated so as to hold the wafer 2 on the chuck table 41 by suction (wafer holding step). After the wafer 2 is thus suction held on the chuck table 41, the chuck table 41 is rotated, for example, at 300 rpm, in the direction of arrow 41a in FIG. 8A. While the chuck table 41 is thus rotated, the grinding wheel 424 of the grinding means 42 is rotated, for example, at 6,000 rpm in the direction of arrow 424a in FIG. 8A. While the chuck table 41 and the grinding wheel 424 are rotated in this manner, the grindstones 426 constituting the grinding wheel 424 are brought into contact with the one side 2a as the upper surface of the wafer 2, namely, the work surface, as shown in FIG. 8B, and the grinding wheel 424 is put into a predetermined amount of grinding feed in the downward direction (in the direction perpendicular to the holding surface of the chuck table 41) at a grinding feed speed of, for example, 1 μm/second as indicated by arrow 424b in FIGS. 8A and 8B. As a result, the one side 2a as the upper surface of the wafer 2 is ground, to form the wafer 2 into a predetermined thickness (for example, 300 μm). Even when the wafer 2 is thus ground to the predetermined thickness, warping of the wafer 2 does not take place, since the peripheral wafer portion where the crystal strains are remaining has been removed from the wafer 2. Consequently, in stacking a light emitting layer on the ground side of the wafer 2 in a subsequent step, a light emitting layer having a uniform thickness can be formed because of the absence of warp.

The present invention is not limited to the details of the above described preferred embodiments. The scope of the invention is defined by the appended claims and all changes and modifications as fall within the equivalence of the scope of the claims are therefore to be embraced by the invention.

What is claimed is:
1. A method of processing a wafer comprising:
   slicing a single crystal ingot to form a wafer,
      removing crystal strains remaining in a peripheral portion of the wafer, and
      grinding the wafer to a predetermined thickness,
      wherein the crystal strain is removed by using a laser beam having such a wavelength as to be transmitted through the wafer, applying the laser beam to the wafer from one side of the wafer, in positions located along a margin of the wafer and spaced a predetermined distance inward from the margin, so as to cause growth of fine holes and amorphous regions shielding the fine holes, over a range from the one side to other side of the wafer, thereby forming shield tunnels in an annular pattern, and exerting external force on the wafer along the shield tunnels to break the wafer in a region of the shield tunnels, thereby removing the peripheral portion where the crystal strains are remaining.
2. The method of processing a wafer according to claim 1, further comprising a mark forming step of forming a mark indicative of a crystal orientation, in a position on an inner side of a laser beam-applied region on the one side of the wafer.

* * * * *